United States Patent
Li et al.

(10) Patent No.: US 10,069,446 B2
(45) Date of Patent: Sep. 4, 2018

(54) BRUSHLESS SERVO

(71) Applicant: UBTECH Robotics Corp., Shenzhen (CN)

(72) Inventors: Youpeng Li, Shenzhen (CN); Youjun Xiong, Shenzhen (CN)

(73) Assignee: UBTECH ROBOTICS CORP., Shenzhen (CN)

( * ) Notice: Subject to any disclaimer, the term of this patent is extended or adjusted under 35 U.S.C. 154(b) by 0 days.

(21) Appl. No.: 15/607,477

(22) Filed: May 27, 2017

(65) Prior Publication Data
US 2018/0191277 A1 Jul. 5, 2018

(30) Foreign Application Priority Data
Dec. 29, 2016 (CN) .................... 2016 2 1472040 U

(51) Int. Cl.
*H02P 6/08* (2016.01)
*H02K 29/06* (2006.01)
*H05K 1/14* (2006.01)
*H05K 1/02* (2006.01)
*H02P 7/00* (2016.01)

(52) U.S. Cl.
CPC .............. *H02P 6/08* (2013.01); *H02K 29/06* (2013.01); *H05K 1/0213* (2013.01); *H05K 1/148* (2013.01); *H02P 7/00* (2013.01)

(58) Field of Classification Search
CPC .. H02P 6/08; H02P 7/00; H02K 29/06; H05K 1/148

USPC ...................................................... 318/400.01
See application file for complete search history.

(56) References Cited

U.S. PATENT DOCUMENTS

| | | | |
|---|---|---|---|
| 2004/0187495 A1* | 9/2004 | Ando ..................... | F01D 17/16 60/602 |
| 2005/0167183 A1* | 8/2005 | Tominaga ............ | B62D 5/0406 180/444 |
| 2008/0224553 A1* | 9/2008 | Abe ........................ | H02K 5/15 310/71 |
| 2009/0196062 A1* | 8/2009 | Ji ........................... | B60Q 1/076 362/524 |
| 2009/0295325 A1* | 12/2009 | Sekine ................. | B62D 5/0406 318/646 |
| 2010/0242642 A1* | 9/2010 | Ganter .................... | F16H 25/20 74/89.23 |
| 2012/0119601 A1* | 5/2012 | Tanaka ................... | H02K 5/148 310/52 |
| 2017/0350388 A1* | 12/2017 | Quintarelli ............. | F04B 53/22 |

* cited by examiner

Primary Examiner — Kawing Chan

(57) ABSTRACT

A brushless servo includes: a DC brushless motor having an output shaft; a reduction gearbox including a speed reduction mechanism; and a control circuit board including a number of layers of PCBs that are spaced apart from each other, and two adjacent PCBs are electrically connected to each other via a flexible circuit boards. The output shaft of the DC brushless motor is connected to the speed reduction mechanism in the reduction gearbox, and the brushless DC motor and the control circuit board are arranged side by side at one side of the reduction gearbox.

12 Claims, 3 Drawing Sheets

BRUSHLESS SERVO

CROSS REFERENCE TO RELATED APPLICATIONS

This application claims priority to Chinese Patent Application No. 201621472.040.7, filed Dec. 29, 2016, which is hereby incorporated by reference herein as if set forth in its entirety.

BACKGROUND

1. Technical Field

The present disclosure generally relates to the servos, and particularly to a brushless servo.

2. Description of Related Art

Typically, servos include brushed servos and brushless servos. The difference between them is that brushed servos use brushed motors, while brushless sears use brushless motors. A brushed motor includes a rotor including a commutator and rotor windings and a stator including stator core and brushes. Brushed motors are a mature technology, but have some drawbacks. For example, some components tend to be worn, much heat is generated, thermal efficiency is not high, and it needs to change the brushes regularly. Compared with the brushed motors, brushless motors have a longer life and higher thermal efficiency.

The control circuit for a brushed motor is simpler than the control circuit for a brushless motor and needs less components. When a servo switches from using a brushed motor to using a brushless motor, the size of the control circuit becomes larger. In order to use a brushless motor, a larger circuit board may be used for the larger control circuit, which is not conducive to the miniaturization of the servo. Another solution is to keep the size of the circuit board unchanged and use less components for the control circuit, which results in that the control circuit has a limited function.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawing all the views are schematic, and like reference numerals designate corresponding parts throughout the several views.

DETAILED DESCRIPTION

Figure 1:
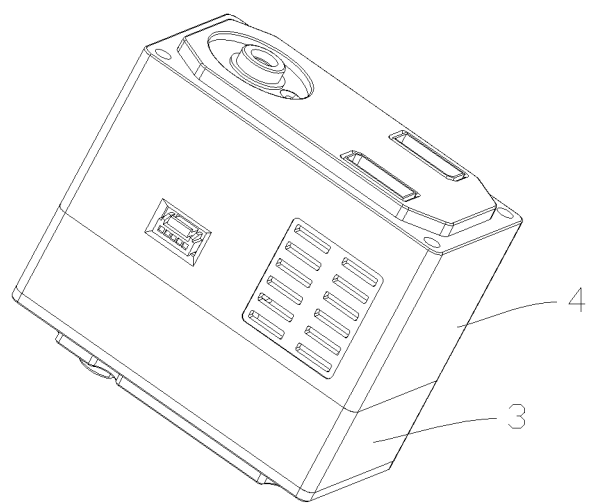
FIG. 1 is an isometric view of a joint structure according to a first embodiment.

The disclosure is illustrated by way of example and not by way of limitation in the figures of the accompanying drawings, in which like reference numerals indicate similar elements. It should be noted that references to "an" or "one" embodiment in this disclosure are not necessarily to the same embodiment, and such references can mean "at least one" embodiment.

Figure 2:
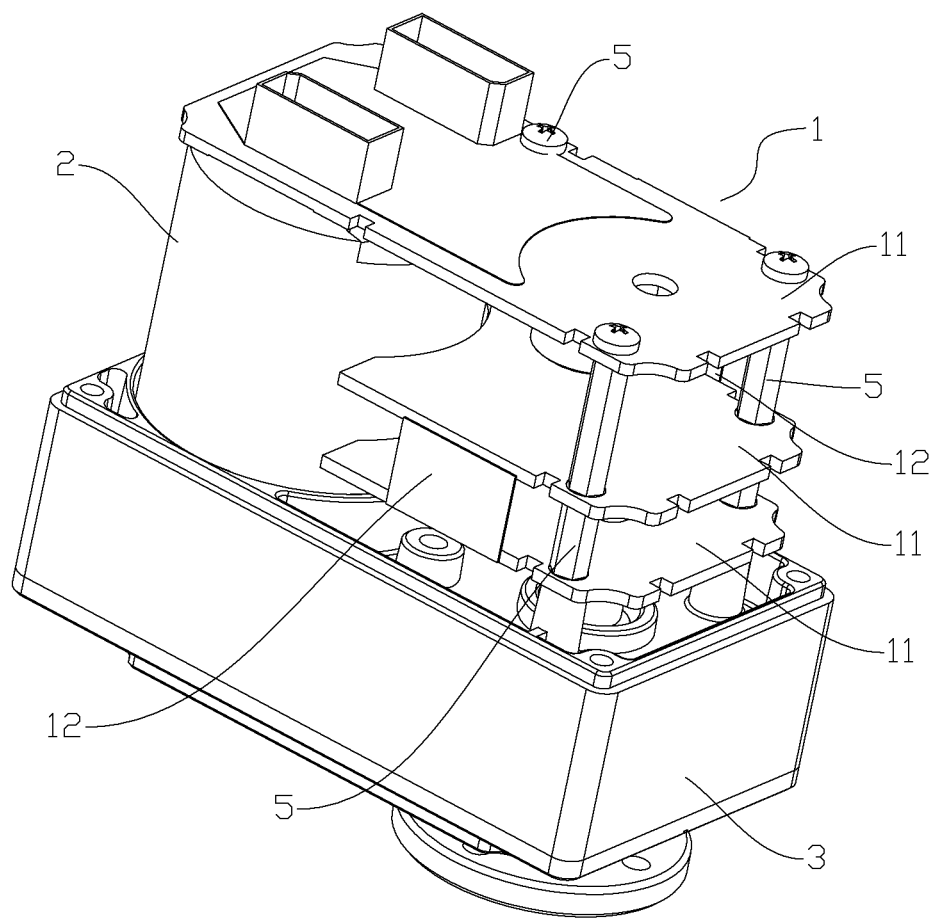
FIG. 2 is an isometric view of the joint structure of FIG. 1 with some components omitted for clarity.
Figure 3:
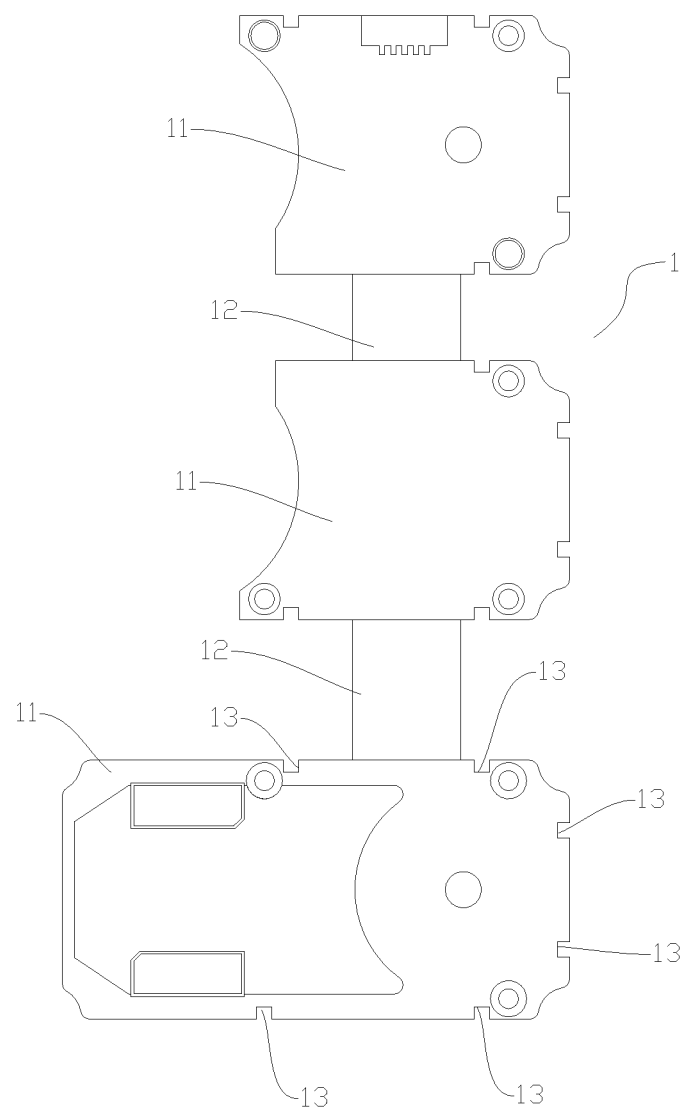
FIG. 3 is an isometric exploded view of the joint structure of FIG. 2.

Referring to FIGS. 1-3, a brushless servo includes a control circuit board a direct current (DC) brushless motor 2 and a reduction gearbox 3. The output shaft of the DC brushless motor 2 is connected to the speed reduction mechanism in the reduction gearbox 3. The motor 2 and the control circuit board 1 are arranged side by side at one side of the reduction gearbox 3. The control circuit board 1 includes a number of layers of PCBs 11 that are spaced apart from each other, and two adjacent PCBs 11 are electrically connected to each other via a flexible circuit board 12. With such configuration, the control circuit board 1 occupies less space, which facilitates the miniaturization of the brushless servo. In addition, the control circuit board 1 can provide functions the same as a conventional control circuit board with all of its components arranged on a unitary board.

In the embodiment, the DC brushless motor 2 and the reduction gearbox 3 are arranged along a height-wise direction of the brushless servo. The DC brushless motor 2 and the control circuit board are arranged along a length-wise direction of the brushless servo. The PCBs 11 are arranged along the height-wise direction of the brushless servo. With such configuration, it is simple and compact in structure, which is conducive to the miniaturization of the brushless servo and reduces the size and weight of the brushless servo.

In the embodiment, the uppermost one of the PCBs 11 includes an end located adjacent to the top of the DC brushless motor 2. The lowermost one of the PCBs 11 is located adjacent to the top of the reduction gearbox 3. The distance between the uppermost PCB 11 and the lowermost PCB 11 is substantially the same as the height of the motor 2. With such configuration, it will not increase the height of the brushless servo, which is conducive to reduce the size and weight of the brushless servo.

In the embodiment, the uppermost PCB 11 includes two protruding interfaces that are used for electrically connecting with other components.

In the embodiment, one end of the uppermost one of the PCBs 11 stays in contact with the top of the DC brushless motor 2. The other PCBs each include a left end that has a shape matching and contacting a circumferential surface of the DC brushless motor 2. The motor 2 functions as a support for the uppermost PCB 11. It increases the compactness of structure and reduces the size and weight of the brushless servo through the left ends of the other PCBs 11 being shaped to match and contact the circumferential surface of the motor 2. In addition, it is conducive to increase the overall stability of the brushless servo by the left ends of the other PCBs 11 contacting the circumferential surface of the motor 7.

In one embodiment, at least one of the PCBs 11 includes a left end that has a shape matching and contacting a circumferential surface of the DC brushless motor 2. The lowermost one of the PCBs 11 is located adjacent to a top of the reduction gearbox. With such configuration, it is simple and compact in structure and is conducive to reduce the size and weight of the brushless servo.

In one embodiment, each PCB 11 includes a left end shaped to match and contact the circumferential surface of the motor 2. With such configuration, it is simple and compact in structure, which reduces the size and weight of the brushless servo without affecting the function thereof.

In one embodiment, the flexible circuit boards 12 are located at a front end or a rear end of the control circuit board 1. The flexible circuit boards 12 are arranged to avoid the motor 2, which allows the left ends of the PCBs 11 to contact the circumferential surface of the motor 2. With such configuration, it is simple and compact in structure and is conducive to reduce the size and weight of the brushless servo.

In one embodiment, a projection of each of the DC brushless motor 2 and the control circuit board 1 is located within a range defined by a periphery of the reduction gearbox 3. The housing 4 of the brushless servo is located on a top of the reduction gearbox 3. The housing 4 and the reduction gearbox 3 corporately define a receiving chamber. The DC brushless motor 2 and the control circuit board 1 are received in the receiving chamber. The total dimension for the mown 2 and the control circuit board 1 long the length wise direction of the brushless servo is smaller than the length of the reduction gearbox 3, which is conducive to reduce the length of the brushless servo. The housing 4 of the servo has a length the same as the length of the reduction gearbox 3. The casing of the reduction gearbox 3 may be a portion of the housing 4. The housing 4 defines plural through holes for heat dissipation.

In one embodiment, the PCBs 11 are connected to one another via fixing posts 5 arranged therebetween. The lower ends of the fixing posts 5 are connected to the reduction gearbox 3. Each of the PCBs 11 defines one or more notches 13 at an edge thereof, the housing 4 includes one or more protrusions engaged with the one or more notches. The housing 4 thus can provide a support to the PCBs 11. The fixing posts 5 connect the PCBs 11 together and provide support to the PCBs 11. In addition, the fixing posts 5 may be have some flexibility so as not to damage the PCBs 11.

The number of the PCBs 11 is three, and the number of the flexible circuit boards 12 is two. The flexible circuit board 12 is bent such that the PCBs 11 can be arranged to be parallel to each other. The number of the fixing posts 5 is three, and the three fixing posts 5 are located at vertices of a triangle. As shown in FIG. 3, it is convenient to place the three PCBs 11 on a flat surface and then connect the PCBs 11 via the two flexible circuit boards 12. When installing the PCBs 11, the flexible circuit boards 12 are bent to allow the three PCBs 11 to be parallel to each other. The three PCBs 11 are then fixed to the reduction gearbox 3 through the fixing posts 5. The fixing posts 5 are located at vertices of a triangle so as to ensure the overall stability of the structure. It is to be understood that the number of the PCBs 11 and the fixing posts 5 is not limited and can vary according to need.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A brushless servo comprising:
   a direct current (DC) brushless motor comprising an output shaft;
   a reduction gearbox comprising a speed reduction mechanism; and
   a control circuit board comprising a plurality of layers of printed circuit boards (PCBs) that are spaced apart from each other, and two adjacent PCBs are electrically connected to each other via a flexible circuit board;
   wherein the output shaft of the DC brushless motor is connected to the speed reduction mechanism in the reduction gearbox, the DC brushless motor and the control circuit board are arranged side by side at one side of the reduction gearbox, the DC brushless motor and the reduction gearbox are arranged along a height-wise direction of the brushless servo, the DC brushless motor and the control circuit board are arranged along a length-wise direction of the brushless servo, and the plurality of layers of PCBs are arranged along the height-wise direction of the brushless servo; and
   wherein a lowermost one of the plurality of layers of PCBs is located adjacent to a top of the reduction gearbox, and at least one of the plurality of layers of PCBs comprises a left end that has a shape matching and contacting a circumferential surface of the DC brushless motor.

2. The brushless servo of claim 1, wherein an uppermost one of the plurality of layers of PCBs comprises an end located adjacent to a top of the DC brushless motor.

3. The brushless servo of claim 2, wherein the end of the uppermost one of the plurality of layers of PCBs stays in contact with the top of the DC brushless motor, and the other PCBs each comprise a left end that has a shape matching and contacting a circumferential surface of the DC brushless motor.

4. The brushless servo of claim 1, wherein the flexible circuit boards are located at a front end or a rear end of the control circuit board.

5. The brushless servo of claim 1 further comprising a housing, wherein a projection of each of the DC brushless motor and the control circuit board on a top of the reduction gearbox is located within a range defined by a periphery of the reduction gearbox, the housing is located on a top of the reduction gearbox, the housing and the reduction gearbox corporately define a receiving chamber, and the DC brushless motor and the control circuit board are received in the receiving chamber.

6. The brushless servo of claim 1 further comprising a housing, wherein the plurality of layers of PCBs are connected to one another via fixing posts arranged therebetween, lower ends of the fixing posts are connected to the reduction gearbox, each of the PCBs defines one or more notches at an edge thereof the housing comprises one or more protrusions engaged with the one or more notches.

7. The brushless servo of claim 6, wherein the number of the PCBs is three, the number of the flexible circuit boards is two, the PCBs are parallel to each other, the number of the fixing posts is three, and the three fixing posts are located at vertices of a triangle.

8. A brushless servo comprising:
   a direct current (DC) brushless motor comprising an output shaft;
   a reduction gearbox comprising a speed reduction mechanism; and
   a control circuit board comprising a plurality of layers of printed circuit boards (PCBs) that are spaced apart from each other, and two adjacent PCBs are electrically connected to each other via a flexible circuit board;
   wherein the output shaft of the DC brushless motor is connected to the speed reduction mechanism in the reduction gearbox, the DC brushless motor and the control circuit board are arranged side by side at one side of the reduction gearbox, the DC brushless motor and the reduction gearbox are arranged along a height-wise direction of the brushless servo, the DC brushless motor and the control circuit board are arranged along a length-wise direction of the brushless servo, and the plurality of layers of PCBs are arranged along the height-wise direction of the brushless servo;

wherein an uppermost one of the plurality of layers of PCBs comprises an end located adjacent to a top of the DC brushless motor, and a lowermost one of the plurality of layers of PCBs is located adjacent to a top of the reduction gearbox; and wherein the end of the uppermost one of the plurality of layers of PCBs stays in contact with the top of the DC brushless motor, and the other PCBs each comprise a left end that has a shape matching and contacting a circumferential surface of the DC brushless motor.

9. The brushless servo of claim 8, wherein the flexible circuit boards are located at a front end or a rear end of the control circuit board.

10. The brushless servo of claim 8 further comprising a housing, wherein a projection of each of the DC brushless motor and the control circuit board on a top of the reduction gearbox is located within a range defined by a periphery of the reduction gearbox, the housing is located on a top of the reduction gearbox, the housing and the reduction gearbox corporately define a receiving chamber, and the DC brushless motor and the control circuit board are received in the receiving chamber.

11. The brushless servo of claim 8 further comprising a housing, wherein the plurality of layers of PCBs are connected to one another via fixing posts arranged therebetween, lower ends of the fixing posts are connected to the reduction gearbox, each of the PCBs defines one or more notches at an edge thereof, the housing comprises one or more protrusions engaged with the one or more notches.

12. The brushless servo of claim 11, wherein the number of the PCBs is three, the number of the flexible circuit boards is two, the PCBs are parallel to each other, the number of the fixing posts is three, and the three fixing posts are located at vertices of a triangle.

* * * * *